(12) United States Patent
Xu et al.

(10) Patent No.: US 12,336,218 B2
(45) Date of Patent: Jun. 17, 2025

(54) ENHANCED RADIO FREQUENCY SWITCH AND FABRICATION METHODS THEREOF

(71) Applicant: Powerlite Semiconductor (Shanghai) Co., Ltd, Shanghai (CN)

(72) Inventors: Shuming Xu, Shanghai (CN); Hang Fan, Shanghai (CN)

(73) Assignee: Powerlite Semiconductor (Shanghai) Co., Ltd., Shanghai (CN)

( * ) Notice: Subject to any disclaimer, the term of this patent is extended or adjusted under 35 U.S.C. 154(b) by 838 days.

(21) Appl. No.: 17/523,437

(22) Filed: Nov. 10, 2021

(65) Prior Publication Data
US 2023/0102053 A1    Mar. 30, 2023

(30) Foreign Application Priority Data

Sep. 29, 2021  (CN) .......................... 202111168228.8

(51) Int. Cl.
| H10D 64/00 | (2025.01) |
| H10D 30/01 | (2025.01) |
| H10D 30/63 | (2025.01) |
| H10D 64/27 | (2025.01) |
| H10D 84/83 | (2025.01) |

(52) U.S. Cl.
CPC ........... *H10D 30/63* (2025.01); *H10D 30/025* (2025.01); *H10D 64/518* (2025.01); *H10D 84/83* (2025.01)

(58) Field of Classification Search
CPC .............. H10D 64/518; H01L 29/7827; H01L 29/42376; H01L 29/66666; H01L 27/088
See application file for complete search history.

(56) References Cited

U.S. PATENT DOCUMENTS

| 4,941,026 A | * | 7/1990 | Temple ............... H01L 29/4236 257/370 |
| 9,755,063 B1 | | 9/2017 | Howard et al. |

OTHER PUBLICATIONS

Tinella et al., "A 0.7dB Insertion Loss CMOS-SOI Antenna Switch with more than 50dB Isolation over the 2.5 to 5GHz Band", ESSCIRC, pp. 483-486; 2002.
Wolf et al., "A Thin-film SOI 180nm CMOS RF Switch", Research Gate, pp. 1-5, Conference Paper—2009.
Yu Bo, "Design of RF Silicon on Insulator (SOI) Switches for Ultra Wideband Wireless Communication Applications", Nanyang Technological University, School of Electrical & Electronic Engineering, pp. 1-162, 2017.

* cited by examiner

*Primary Examiner* — Mark V Prenty
(74) *Attorney, Agent, or Firm* — Myers Bigel, P.A.

(57) ABSTRACT

A radio frequency (RF) switch device includes a semiconductor substrate, doped with an impurity of a first conductivity type at a first doping concentration level, and a mesa extending vertically from an upper surface of the substrate and formed contiguous therewith. The mesa includes a drift region doped with the impurity of the first conductivity type at a second doping concentration level, the second doping concentration level being less than the first doping concentration level. The mesa forms a primary current conduction path in the RF switch device. The RF switch device further includes an insulator layer disposed on at least a portion of the upper surface of the substrate and sidewalls of the mesa, and at least one gate disposed on at least a portion of an upper surface of the insulator layer, the gate at least partially surrounding the mesa.

13 Claims, 12 Drawing Sheets

ENHANCED RADIO FREQUENCY SWITCH AND FABRICATION METHODS THEREOF

CROSS-REFERENCE TO RELATED APPLICATIONS

This application claims priority to Chinese Patent Application No. 202111168228.8, filed on Sep. 29, 2021, the disclosure of which is incorporated by reference herein in its entirety for all purposes.

BACKGROUND

The present invention relates generally to the electrical, electronic and computer arts, and, more particularly, to radio frequency switches and fabrication methods.

A radio frequency (RF) switch is a device that routes high-frequency signals through transmission paths. The need for RF switches continues to increase, due at least in part to the increasing demand for wireless communications at higher frequencies and wider bandwidths. The use of RF switches and RF switching circuitry affords the ability to combine higher frequencies and wider bandwidths with the integration of multiple RF interfaces and antennas, thus enabling designers to meet the demands on wireless communications and advance the capabilities and functionality of the field of wireless communications in general.

Various electrical parameters may be used to characterize the performance of RF switch designs, but four parameters are often considered to be of fundamental importance to a designer due to their strong interdependence: isolation, insertion loss, switching time and power handling. Isolation refers to the degree of attenuation from an unwanted signal detected at a port of interest of the RF switch, or the measure of how effective a switch enters its "off" state. Isolation becomes more important at higher frequencies, where parasitic elements can have a significant influence on switch performance. Insertion loss, also known as transmission loss, refers to the total power lost through the RF switch during its "on" state. Switching time refers to the amount of time an RF switch requires when changing between its "on" and "off" states, which can range from several microseconds (high-power RF switches) to a few nanoseconds (low-power, high-speed devices). Power handling refers to the amount of input power the RF switch can safely handle without sustaining permanent damage or degradation of electrical performance and is very dependent on the design and materials used.

There are several types of RF switches that are typically used, including microelectromechanical systems (MEMS)-based switches, PIN diodes, and solid-state (e.g., field-effect transistor (FET)-based) switches. Compared to other types of RF switches, MEMS switches offer the benefits of very high isolation, very low insertion loss, high linearity, and potentially low cost. However, MEMS switches also have significant disadvantages, including relatively low speed, the need for high voltage or high current drive, relatively poor reliability and poor integration capability, all of which restrict their use, particularly in high-frequency applications.

PIN diodes are perhaps one of most prevalent types of RF switches. A PIN diode is a device that operates as a variable resistor at RF frequencies. Its resistance varies from less than one ohm in its "on" state to more than 10K ohms in its "off" state. A PIN diode is constructed using a wide, high-resistivity intrinsic (I) region sandwiched between a p-type (P) semiconductor region and an n-type (N) semiconductor region. The p-type and n-type semiconductor regions are typically heavily doped because they are used for ohmic contacts. However, PIN diodes suffer from large biasing current and slow switch speed, among other disadvantages.

A pseudomorphic high-electron-mobility transistor (pHEMT), also known as a heterostructure FET (HFET) or modulation-doped FET (MODFET), is a field-effect transistor incorporating a junction between two materials with different band gaps (i.e., a heterojunction) as the channel instead of a doped channel region, as is generally the case for a metal-oxide-semiconductor field-effect transistor (MOSFET). A pHEMT device fabricated on a type III-V semiconductor substrate provides good performance for use as an RF switch. However, some major disadvantages of III-V compound-based pHEMT technology are higher wafer cost and poor integration capability compared to mature silicon technologies, among other disadvantages.

The continuous downscaling of complementary metal-oxide-semiconductor (CMOS) fabrication technologies has made the use of bulk CMOS for RF applications a very attractive alternative. However, while CMOS appears to be the best solution for the integration of RF, intermediate frequency (IF), and baseband circuitry on the same die, some significant disadvantages remain with bulk silicon substrates for use in RF applications, including poor linearity and high insertion loss, among other drawbacks.

SUMMARY

The present invention, as manifested in one or more embodiments, beneficially provides an enhanced radio frequency (RF) switch device, and methods for fabricating such a device.

In accordance with an embodiment of the invention, an RF switch device includes a semiconductor substrate, doped with an impurity of a first conductivity type at a first doping concentration level, and a mesa extending substantially vertically from an upper surface of the substrate and formed contiguous therewith. The mesa includes a drift region doped with the impurity of the first conductivity type at a second doping concentration level, the second doping concentration level being less than the first doping concentration level. The mesa forms a primary current conduction path in the RF switch device. The RF switch device further includes an insulator layer disposed on at least a portion of the upper surface of the substrate and sidewalls of the mesa, and at least one gate disposed on at least a portion of an upper surface of the insulator layer, the gate at least partially surrounding the mesa.

In accordance with an embodiment of the invention, a method of fabricating an RF switch device includes: doping a semiconductor substrate with an impurity of a first conductivity type at a first doping concentration level; forming at least one mesa extending vertically from an upper surface of the substrate and contiguous therewith, the mesa including a drift region doped with the impurity of the first conductivity type at a second doping concentration level, the second doping concentration level being less than the first doping concentration level, the mesa forming a primary current conduction path in the RF switch device; forming an insulator layer on at least a portion of the upper surface of the substrate and sidewalls of the mesa; and forming at least one gate on at least a portion of an upper surface of the insulator layer, the gate at least partially surrounding the mesa.

Techniques of the present invention can provide substantial beneficial technical effects. By way of example only and without limitation, an RF switch device according to one or more embodiments of the invention may provide one or more of the following advantages:

lower on-state resistance $R_{DS\text{-}on}$
lower parasitic capacitance;
higher switching speed;
higher off-state blocking voltage;
better isolation;
higher power handling capability.

These and other features and advantages of the present invention will become apparent from the following detailed description of illustrative embodiments thereof, which is to be read in connection with the accompanying drawings.

BRIEF DESCRIPTION OF THE SEVERAL VIEWS OF THE DRAWINGS

Non-limiting and non-exhaustive embodiments of the present invention will be described with reference to the following drawings which are presented by way of example only, wherein like reference numerals (when used) indicate corresponding elements throughout the several views unless otherwise specified, and wherein.

It is to be appreciated that elements in the figures are illustrated for simplicity and clarity. Common but well-understood elements that may be useful or necessary in a commercially feasible embodiment may not be shown in order to facilitate a less hindered view of the illustrated embodiments.

DETAILED DESCRIPTION

Principles of the present invention, as manifested in one or more embodiments, will be described herein in the context of an illustrative radio frequency (RF) switch device, and methods for fabricating an RF switch device, having enhanced high-frequency performance, reduced insertion loss and increased isolation compared to conventional RF switches, while maintaining high power handling capability. It is to be appreciated, however, that the invention is not limited to the specific device(s) and/or method(s) illustratively shown and described herein. Rather, it will become apparent to those skilled in the art given the teachings herein that numerous modifications can be made to the embodiments shown that are within the scope of the claimed invention. That is, no limitations with respect to the embodiments shown and described herein are intended or should be inferred.

For the purpose of describing and claiming embodiments of the invention, the term MISFET, as may be used herein, is intended to be construed broadly to encompass any type of metal-insulator-semiconductor field-effect transistor. The term MISFET is, for example, intended to encompass semiconductor field-effect transistors that utilize an oxide material as their gate dielectric (i.e., MOSFETs), as well as those that do not. In addition, despite a reference to the term "metal" in the acronyms MISFET and MOSFET, the terms MISFET and MOSFET are also intended to encompass semiconductor field-effect transistors wherein the gate is formed from a non-metal material such as, for instance, polysilicon; the terms "MISFET" and "MOSFET" are used interchangeably herein.

Although the overall fabrication method and structures formed thereby are entirely novel, certain individual/intermediate processing steps required to implement a portion or portions of the method(s) according to one or more embodiments of the invention may utilize conventional semiconductor fabrication techniques and conventional semiconductor fabrication tooling. These techniques and tooling will already be familiar to one having ordinary skill in the relevant arts. Moreover, many of the processing steps and tooling used to fabricate semiconductor devices are also described in a number of readily available publications, including, for example: P. H. Holloway et al., *Handbook of Compound Semiconductors: Growth, Processing, Characterization, and Devices*, Cambridge University Press, 2008; and R. K. Willardson et al., *Processing and Properties of Compound Semiconductors*, Academic Press, 2001, which are incorporated by reference herein in their entireties. It is emphasized that while some individual processing steps are set forth herein, those steps are merely illustrative and one skilled in the art may be familiar with several equally suitable alternatives that would also fall within the scope of the present invention.

It is to be understood that the various layers and/or regions shown in the accompanying figures are not necessarily drawn to scale. Furthermore, one or more semiconductor layers of a type commonly used in such integrated circuit devices may not be explicitly shown in a given figure for economy of description. This does not imply, however, that the semiconductor layer(s) not explicitly shown are omitted in the actual integrated circuit device.

As previously stated, for integrating RF, intermediate frequency (IF) and baseband circuitry on the same die, the use of bulk complementary metal-oxide-semiconductor (CMOS) provides an attractive option. However, some significant challenges remain with bulk silicon substrates for use in RF applications, including poor linearity and high insertion loss, among other disadvantages.

Figure 1:
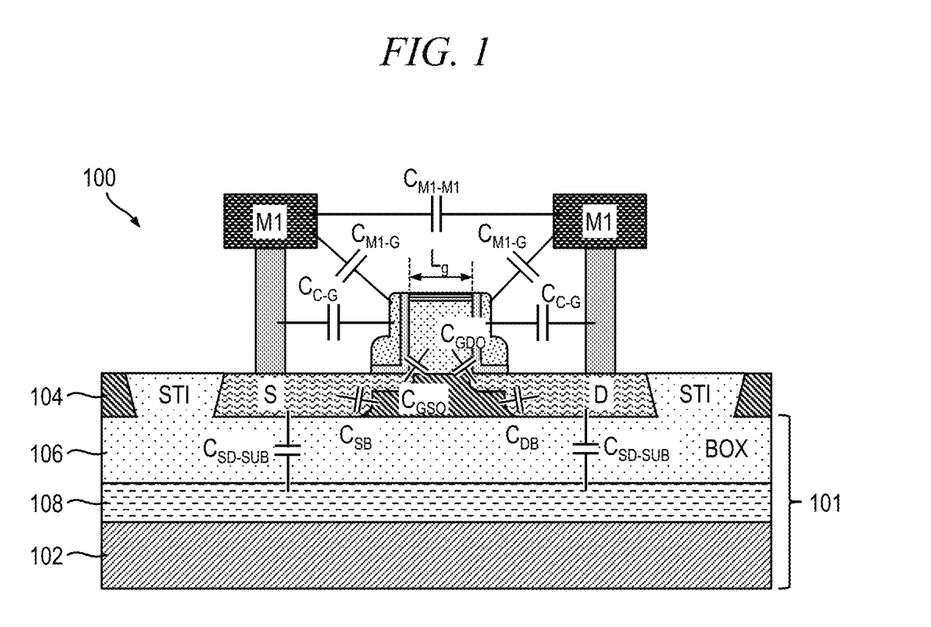
FIG. 1 is a cross-sectional view depicting at least a portion of an exemplary n-type MOSFET (NMOSFET) RF switch device fabricated on a silicon-on-insulator (SOI) substrate.

FIG. 1 is a cross-sectional view depicting at least a portion of an exemplary n-type MOSFET (NMOSFET) RF switch device 100 fabricated on a silicon-on-insulator (SOI) structure 101. With reference to FIG. 1, the NMOSFET device 100 is illustrated with its parasitic capacitance components when the device is in an "off" state. The SOI structure 101 in this example comprises a bulk substrate 102, which may be a high-resistivity silicon substrate, and a layer of single-crystalline silicon 104 (e.g., silicon film) separated from the bulk substrate by an insulator layer 106, which may be a buried oxide (BOX) layer. A trap-rich layer 108 may also be formed on an upper surface of the substrate 102, between the substrate and the insulator layer 106. In SOI wafers the material forming the insulator layer 106 is almost invariably a thermal silicon dioxide ($SiO_2$) layer. Depending on the type of application, the silicon layer 104 can be very thin (e.g., less than about 50 nanometers (nm) for fully depleted transistors), or it can be tens of micrometers (µm) thick. Likewise, a thickness of the insulator layer 106 generally ranges from tens of nanometers to several micrometers.

Forming an RF switch using NMOSFET devices on an SOI structure helps to reduce a drain-to-substrate junction capacitance of NMOSFET on bulk silicon, which improves the RF switch performance and thereby becomes a major technology platform for RF switch devices. However, this technology suffers from at least three primary issues: (i) parasitic capacitance above an upper surface of the silicon layer 104, including contact-to-gate capacitance ($C_{C\text{-}G}$), metal 1-to-metal 1 capacitance ($C_{M1\text{-}M1}$), and metal 1-to-gate capacitance ($C_{M1\text{-}G}$); (ii) parasitic capacitance between source (S) and drain (D) regions and the substrate 102 ($C_{SD\text{-}SUB}$); and (iii) the need for the trap-rich layer 108 to reduce back channel effects. The total parasitic capacitance of the NMOSFET device 100 in the "off" state, $C_{off}$, to at least a first order, can be determined as follows:

$$C_{off} = \frac{C_{SB} \cdot C_{DB}}{C_{SB} + C_{DB}} + \frac{C_{GSO} \cdot C_{GDO}}{C_{GSO} + C_{GDO}} + \frac{C_{SD\text{-}SUB}}{2} + C_{M1\text{-}M1} + \frac{C_{M1\text{-}G}}{2} + \frac{C_{C\text{-}G}}{2},$$

where $C_{SB}$ and $C_{DB}$ represent the parasitic capacitance contributions between the source region and bulk silicon and between the drain region and bulk silicon, respectively, $C_{GSO}$ represents source-to-gate off parasitic capacitance, and $C_{GDO}$ represents drain-to-gate off parasitic capacitance. As an additional disadvantage, an SOI structure is significantly more expensive to fabricate.

Figure 2:
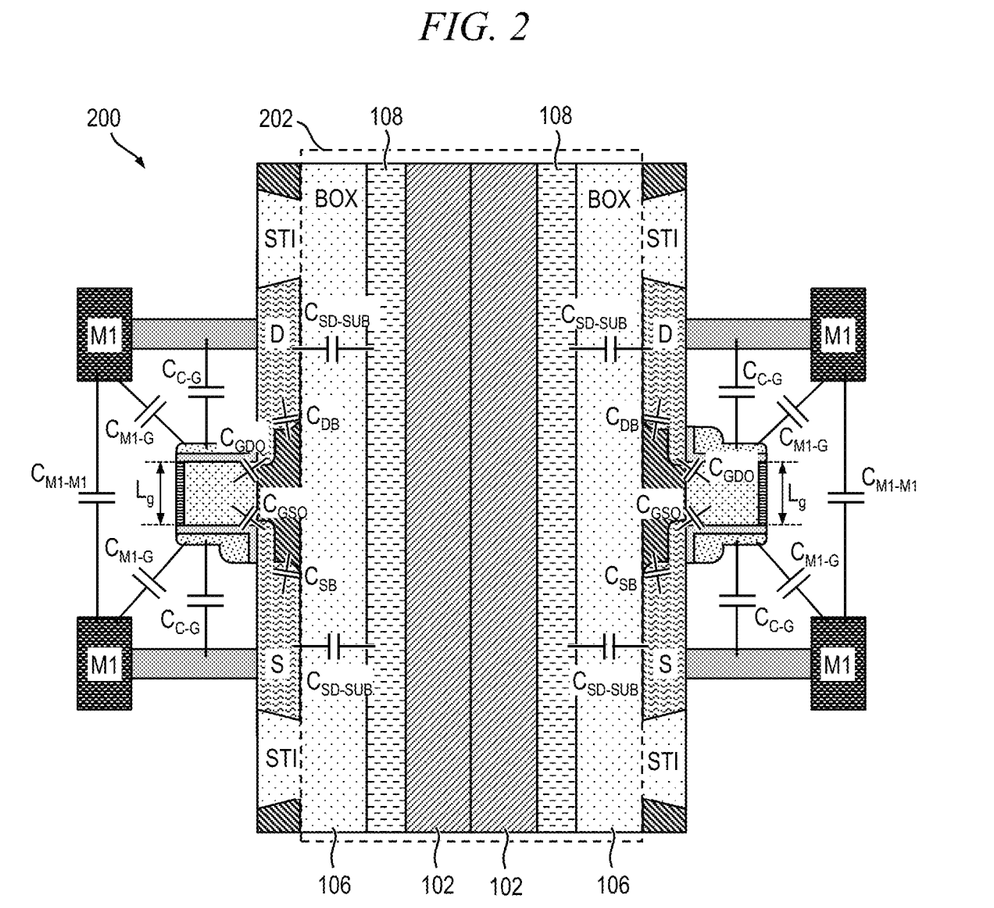
FIG. 2 is a cross-sectional view depicting at least a portion of an exemplary RF switch device including two of the illustrative SOI RF switch devices shown in FIG. 1, with a bottom surface of their respective substrates merged together.

It is highly desirable to minimize substrate issues (e.g., source/drain-to-substrate parasitic capacitance, $C_{SD\text{-}SUB}$) in the SOI RF switch device for improved performance. One way to accomplish this is to merge two RF switch devices back-to-back, as shown in FIG. 2. With reference to FIG. 2, a cross-sectional view conceptually depicts at least a portion of an exemplary RF switch structure 200 including two of the illustrative SOI RF switch devices 100 shown in FIG. 1, with a bottom surface of their respective substrates 102 joined together. A region 202 in the RF switch structure 200 includes the substrates 102, insulator layers 106 and trap-rich layers 108 of the two back-to-back RF switch devices.

Figure 3:
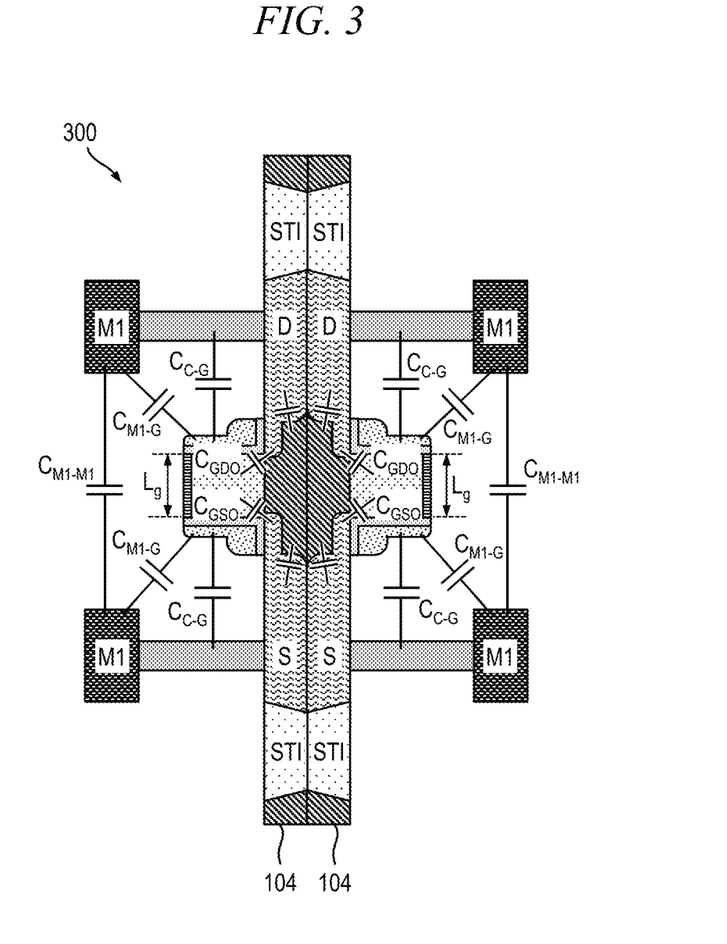
FIG. 3 is a cross-sectional view depicting at least a portion of an exemplary RF switch device formed in a manner consistent with the RF switch device shown in FIG. 2, except that the substrates, insulator layers and trap-rich layers of the merged devices have been removed.

A substrate thickness of the RF switch structure 200 is preferably reduced as much as possible; ideally, a thickness of the substrate is reduced to zero. FIG. 3 is a cross-sectional view conceptually depicting at least a portion of an exemplary RF switch structure 300. The RF switch structure 300 is essentially the same as the illustrative RF switch structure 200 shown in FIG. 2, except that the region 202, including the substrates 102, insulator layers 106 and trap-rich layers 108, has been removed so that the respective silicon layers 104 of the two back-to-back RF switches are merged together. The source and drain regions are shared in the RF switch structure 300, as are the channel regions of the merged devices. In this manner, parasitic capacitances between the source/drain regions and corresponding substrate ($C_{SD\text{-}SUB}$) are beneficially eliminated, thereby enhancing performance of the RF switch, particularly at higher frequencies.

Figure 4:
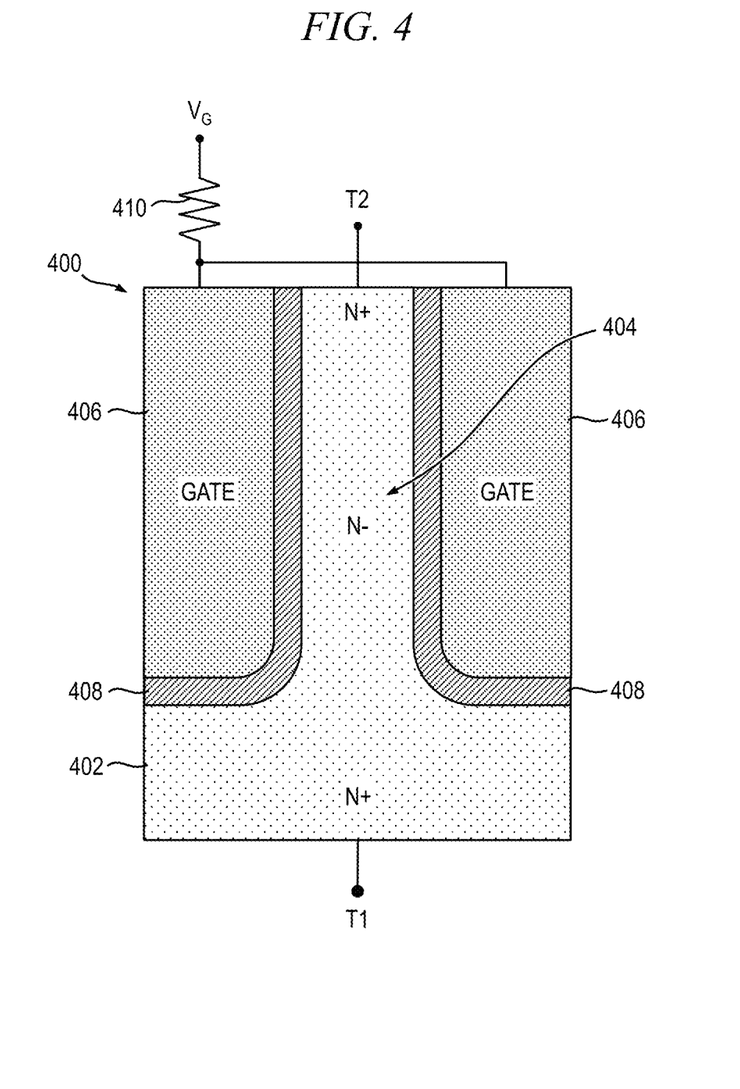
FIG. 4 is a cross-sectional view depicting at least a portion of an exemplary RF switch device having enhanced high-frequency performance, according to one or more embodiments of the present invention.

By way of example only and without limitation, FIG. 4 is a cross-sectional view depicting at least a portion of an exemplary RF switch device 400 having enhanced high-frequency performance, according to one or more embodiments of the invention. The RF switch device 400 illustrates one way to implement the conceptual RF switch structure 300 shown in FIG. 3. Referring now to FIG. 4, the exemplary RF switch device 400 includes a semiconductor substrate 402 having a mesa 404, upstanding vertically from the substrate and formed contiguously therewith. The mesa 404 comprises a doped drift region which functions as a primary current conduction path in the RF switch 400 when the device is in an "on" state.

In this illustrative embodiment, the substrate 402 and mesa 404 preferably comprise low-resistivity, single-crystalline silicon formed using a standard growth and/or deposition process (e.g., epitaxial growth). The substrate 402 is preferably heavily doped with an n-type impurity or dopant (e.g., phosphorous or arsenic), to form an N+ substrate. The drift region of the mesa 404, in one or more embodiments, is preferably doped with an n-type impurity or dopant of lower doping concentration, relative to the doping concentration of the substrate 402, to form an N– drift region. An upper portion of the mesa 404 may be doped with the same impurity type, but at a higher doping concentration relative to the drift region, to thereby form an N+ region proximate the upper surface of the mesa. It is to be appreciated, however, that in one or more embodiments, the substrate 402 and drift region in the mesa 404 may be similarly doped with a p-type impurity (e.g., boron) to form a P+ substrate and a P– drift region, as will become apparent to those skilled in the art.

The RF switch device 400 further includes a pair of gates 406 disposed on an upper surface of at least a portion of the substrate 402 and on opposing vertical sidewalls of the mesa 404. In one or more embodiments, the mesa 404 is surrounded by a gate. In some embodiments, the gate 406 comprises a structure which is concentric with respect to the mesa 404 (e.g., a toroidal (i.e., doughnut) shaped structure which surrounds at least a portion of the mesa 404), although embodiments of the invention are not limited to any specific shape and/or dimensions of the gate. The gates 406 are electrically isolated from the substrate 402 and mesa 404 by an insulating layer 408 disposed on an upper surface of the substrate and sidewalls of the mesa, respectively, between the substrate/mesa and the gates. In one or more embodiments, each of the gates 406 comprises polysilicon material and the insulating layer 408 comprises an oxide, such as, for example, silicon dioxide. It is to be appreciated, however, that embodiments of the invention are not limited to any specific material(s) for forming the gates 406 and/or the insulating layer 408.

A first terminal, T1, is used for providing electrical connection with the substrate 402. Terminal T1, in one or more embodiments, is disposed on a bottom surface of the substrate 402 and electrically connected thereto. A second terminal, T2, is used for providing electrical connection with the mesa 404. Terminal T2, in one or more embodiments, is disposed on the upper surface of the mesa 404. Terminals T1 and T2 may comprise a metal or other conductive material (e.g., silicide).

Terminals T1 and T2 form the input/output ports of the RF switch device 400, through which current will flow when the device is turned on. Since the main terminals T1 and T2 are separated from one another by the thickness of the mesa 404 and substrate 402, which is preferably from about a few microns to a few hundred microns, the parasitic capacitance between the two main terminals (e.g., $C_{M1-M1}$ shown in FIG. 1) will be beneficially eliminated or at least substantially reduced.

The gates 406 are preferably connected together and biased with a voltage, $V_G$, generated by a gate driver circuit (not explicitly shown, but implied) coupled to the gates. The gate driver circuit is preferably adapted to generate a gate voltage for biasing the gates 406 as a function of a gate control signal supplied to an input of the gate driver circuit. In one or more embodiments, a resistor 410 is connected in series between the gates 406 and the gate driver circuit. The resistor 410 preferably serves as a protection element against transient voltage between terminal T1 and the gates 406, or between terminal T2 and the gates.

When the gates 406 are biased to a voltage potential higher than a prescribed threshold voltage $V_T$ (i.e., $V_{gate}-V_{T1}>V_T$, or $V_{gate}-V_{T2}>V_T$, where $V_{T1}$ and $V_{T2}$ are the voltage potentials at terminals T1 and T2, respectively), the mesa 404 becomes an N− resistor and conducts. Furthermore, an electron accumulation layer forms at the mesa 404, proximate an interface of the insulating layer 408 and mesa 404, which will greatly reduce the resistance between terminals T1 and T2. When turned on, an exemplary resistance range of the mesa 404 is about 0.1 milliohm-square millimeter ($m\Omega \cdot mm^2$)–50 $m\Omega \cdot mm^2$, although embodiments of the invention are not limited to any specific resistance value or range. When the gates 406 are biased, relative to the voltage potential at either terminal T1 or T2, to a voltage potential lower than a prescribed threshold voltage $V_T$ (i.e., $V_{gate}-V_{T1}<V_T$, or $V_{gate}-V_{T2}<V_T$), the mesa 404 becomes a depletion region which blocks the current from both terminals T1, T2, thereby turning off the RF switch device 400.

Figure 5:
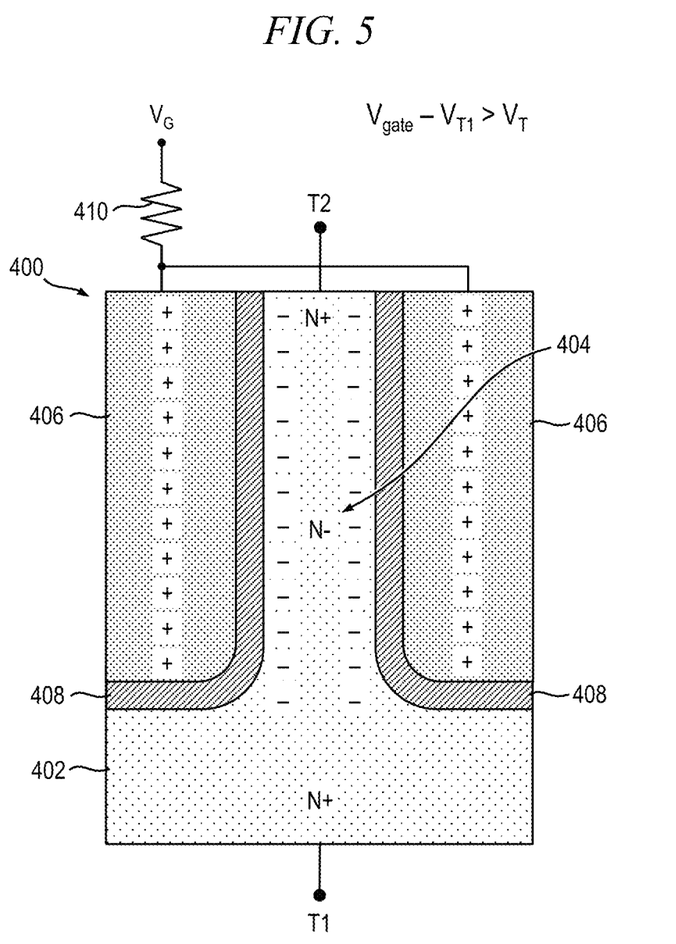
FIG. 5 is a cross-sectional view depicting at least a portion of the exemplary RF switch device shown in FIG. 4 operating in an "on" state, according to one or more embodiments of the present invention.

FIG. 5 is a cross-sectional view depicting at least a portion of the exemplary RF switch device 400 shown in FIG. 4 in an "on" state, according to one or more embodiments of the invention. When the RF switch device 400 is operating in the "on" state, the gate bias potential can be set to be positive with respect to $V_{T1}$ or $V_{T2}$ for further reducing the on-state resistance of the device, thereby reducing insertion loss. Stated another way, the gate 406 should be biased positive relative to $\min(V_T, V_{T2})$; then, device 400 is "on," and current flows from $\max(V_{T1}, V_{T2})$ to $\min(V_{T1}, V_{T2})$. As illustrated conceptually in FIG. 5, with the gates 406 biased positive (e.g., $V_{gate}-V_{T1}>V_T$), electrons, which are the majority charge carriers in the n-type mesa 404, will be drawn into the drift region (by the positively-charged gates), thereby beneficially increasing conduction and reducing on-state resistance in the RF switch device 400; a reduction in on-state resistance correlates to reduced insertion loss.

Figure 6:
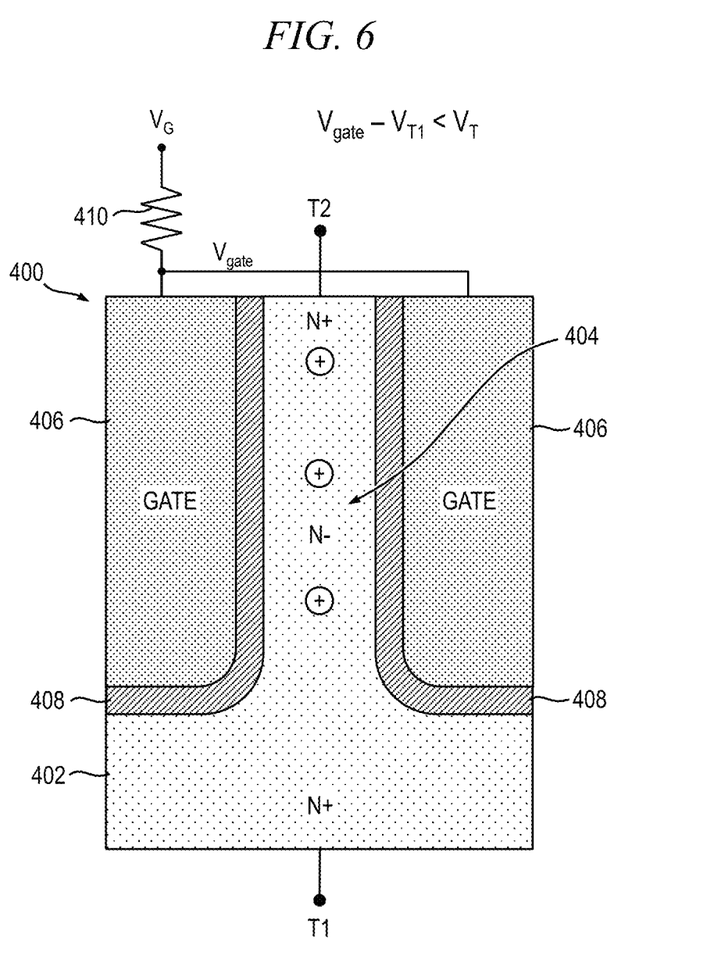
FIG. 6 is a cross-sectional view depicting at least a portion of the exemplary RF switch device shown in FIG. 4 operating in an "off" state, according to one or more embodiments of the present invention.

FIG. 6 is a cross-sectional view depicting at least a portion of the exemplary RF switch device 400 shown in FIG. 4 operating in an "off" state, according to one or more embodiments of the invention. When the gates 406 are biased less than the threshold voltage $V_T$ (i.e., $V_{gate}-V_{T1}<V_T$), for example by grounding the gates, the drift region in the mesa 404 becomes depleted. This device is similar to a depletion mode (rather than an enhancement mode) NMOS device. Thus, generally, the $V_T$ should be a negative value. Then, a negative $V_{gate}$ (relative to, for example, $V_{T1}$) is needed to deplete the mesa 404 and turn off the device. The mobile electrons in n-type mesa 404 are pushed out and the ionized donor impurity with positive charge remains, and the drift region will pinch-off, thereby beneficially increasing off-state resistance in the RF switch device 400; increased off-state resistance correlates directly to increased isolation.

Figure 7A:
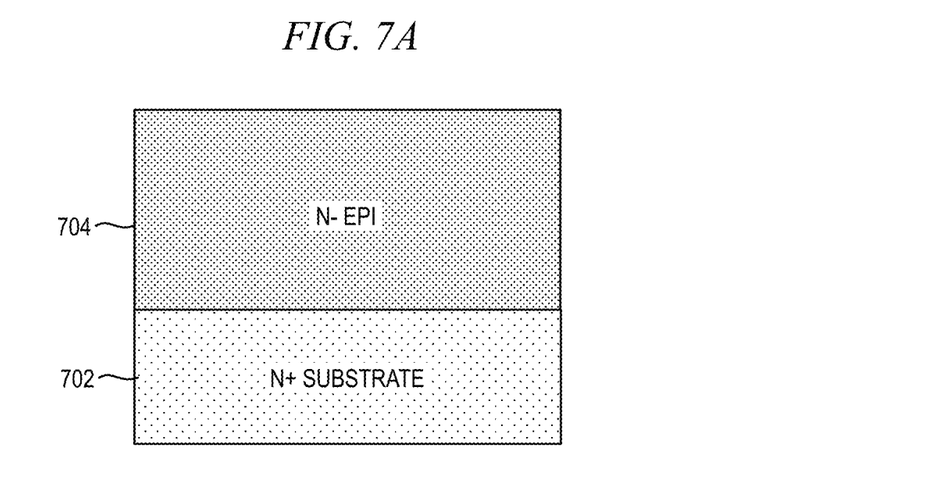
FIGS. 7A-7J are cross-sectional views depicting intermediate steps in an exemplary fabrication process for forming an RF switch device consistent with the illustrative RF switch device shown in FIG. 4, according to one or more embodiments of the present invention.

By way of example only and without limitation, FIGS. 7A-7J are cross-sectional views depicting intermediate steps in an exemplary fabrication process for forming an RF switch device consistent with the illustrative RF switch device 400 shown in FIG. 4, according to one or more embodiments of the invention. With reference to FIG. 7A, the device begins by providing a substrate 702 (i.e., wafer) of a first conductivity type, for example an N+ substrate in this embodiment, and forming an epitaxial layer 704 of the first conductivity type, for example an N− epitaxial layer in this embodiment, on at least a portion of an upper surface of the substrate. The epitaxial layer 704 may be formed, for example, using an epitaxial growth or deposition process, as will be known by those skilled in the art.

Figure 7B:
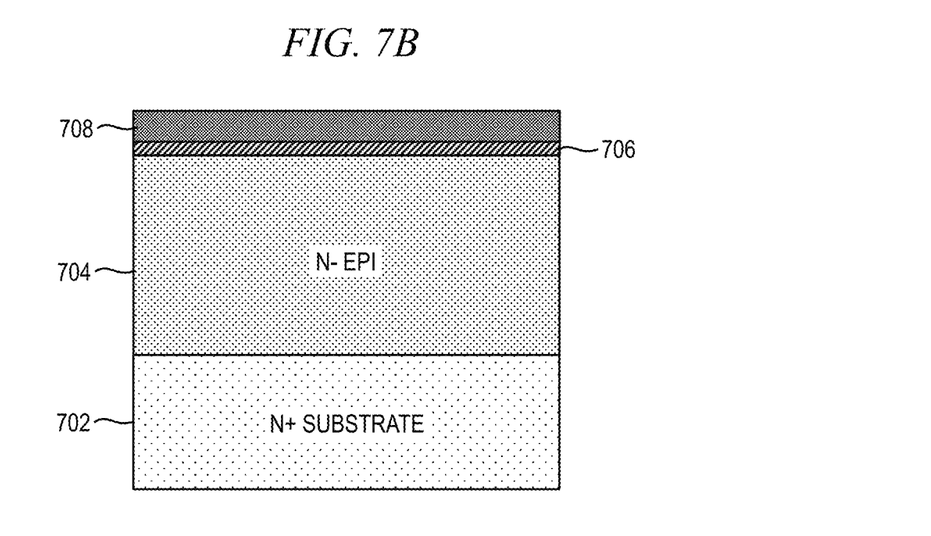
Figure 7C:
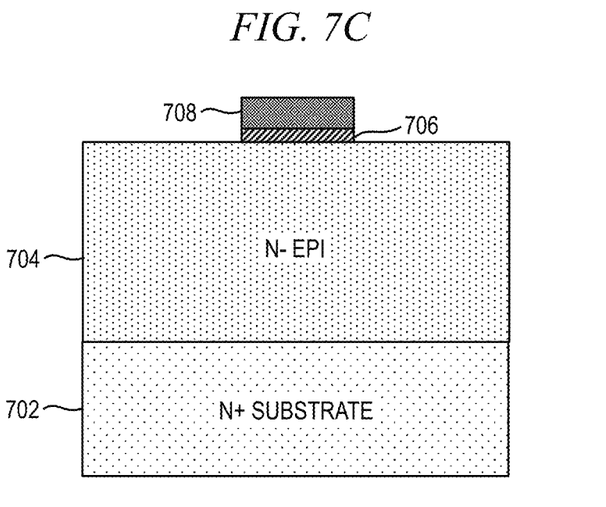

As shown in FIG. 7B, a thin oxide layer 706, which may be a thermal oxide (e.g., $SiO_2$, about 1 nm-50 nm in thickness), is formed on at least a portion of an upper surface of the epitaxial layer 704. A nitride layer 708, or similar, is formed on at least a portion of an upper surface of the oxide layer 706, such as by using a deposition process (e.g., chemical vapor deposition (CVD)). The nitride layer 708 and oxide layer 706 are then patterned and etched, using a standard photolithographic process, as defined by a photolithography mask, to form a hard mask for subsequent processing, as depicted in FIG. 7C. During selective etching to define the hard mask, the epitaxial layer 704 is preferably used as an etch-stop layer, so that only defined portions of the nitride layer 708 and the oxide layer 706 are removed, without etching the underlying epitaxial layer.

Figure 7D:
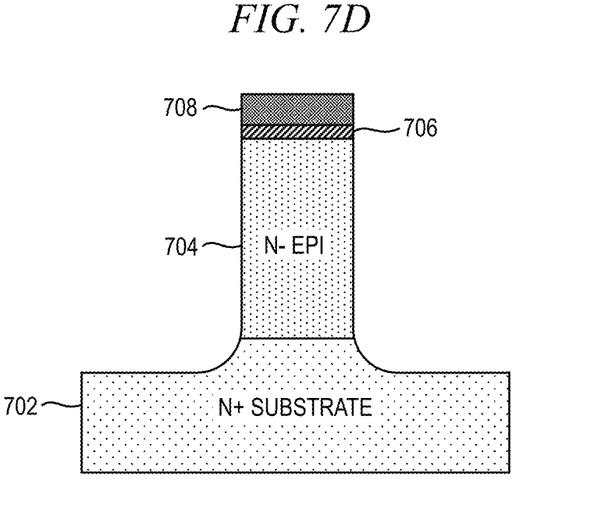
Figure 7E:
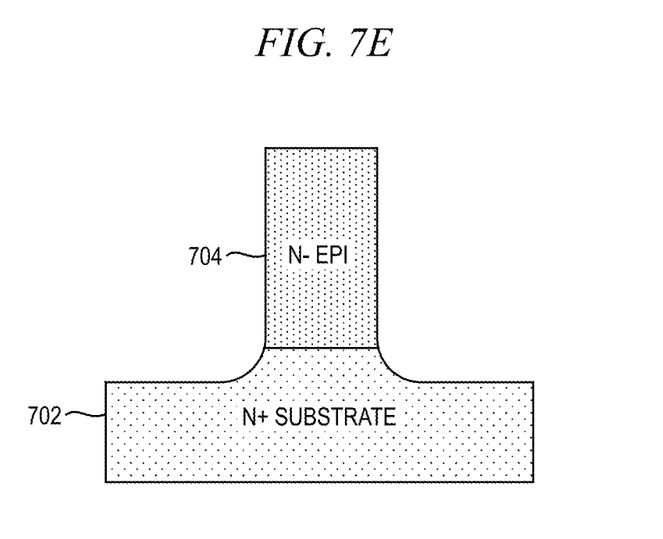

In FIG. 7D, the wafer undergoes a silicon etching process to remove portions of the epitaxial layer 704 not protected by the hard mask (nitride layer 708 and oxide 706). During silicon etching, a portion of the substrate 702 may also be removed, to thereby thin the substrate. The remaining epitaxial layer 704 under the hard mask 708, 706 after etching is an epitaxial pillar structure. The nitride layer 708 and oxide layer 706 are then removed, such as by using a selective etching process, as shown in FIG. 7E.

Figure 7F:
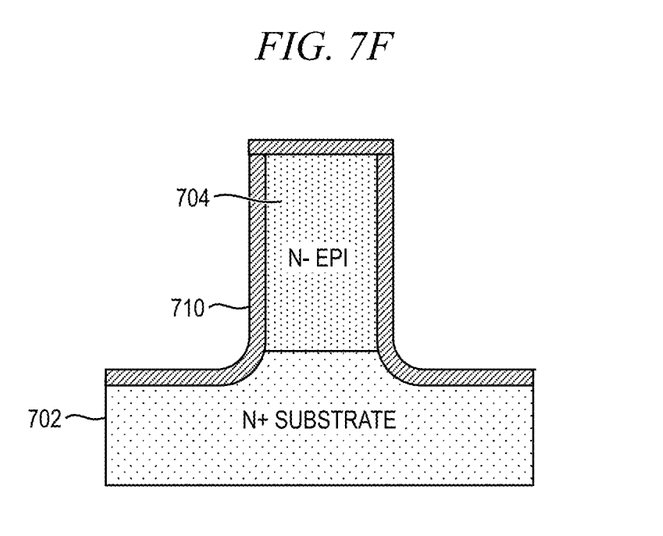
Figure 7G:
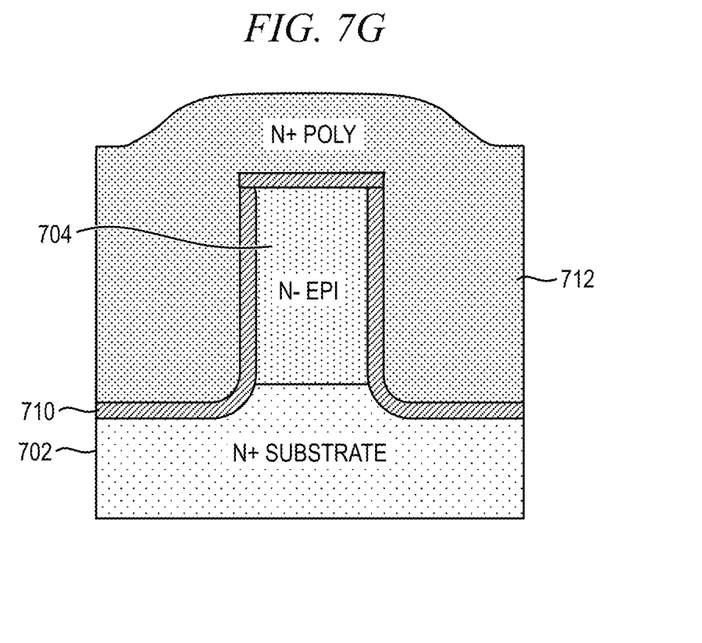

Referring now to FIG. 7F, a thin thermal oxide layer 710 is preferably formed on an upper surface of the substrate 702, as well as sidewalls and an upper surface of the epitaxial layer 704. The oxide layer 710 can be formed using a growth or deposition process. Next, a layer of polysilicon 712 is formed over the surface of the wafer, including an upper surface of the oxide layer 710, as depicted in FIG. 7G. The polysilicon layer 712 may be doped with an impurity, such as an n-type impurity in this example, to form N+ polysilicon.

Figure 7H:
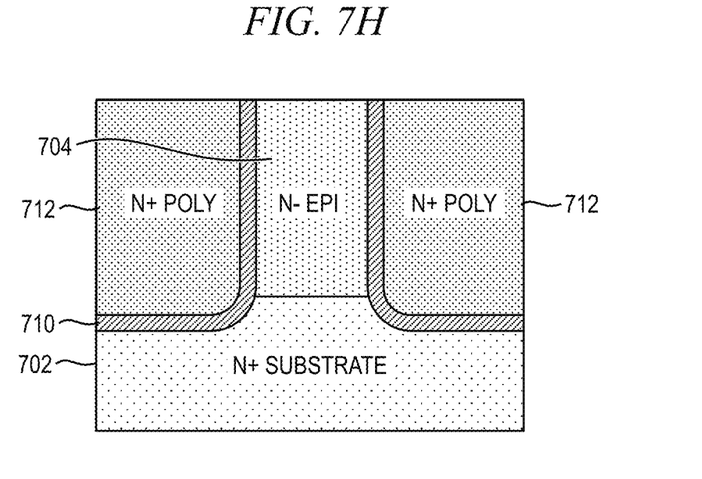

In FIG. 7H, excess polysilicon material is removed from the upper surface of the device using etching and chemical-mechanical polishing (CMP), also referred to as chemical-mechanical planarization. The oxide layer 710 disposed on the upper surface of the epitaxial pillar 704 is also removed using CMP. After CMP, the upper surface of the device is substantially planar. As shown in FIG. 7H, the device comprises the epitaxial layer (mesa or pillar) 704 surrounded by N+ polysilicon regions 712. The polysilicon region 712 are electrically isolated from the epitaxial layer (mesa) 704 by the oxide layer 710 sandwiched between the epitaxial layer and the polysilicon layer.

Figure 7I:
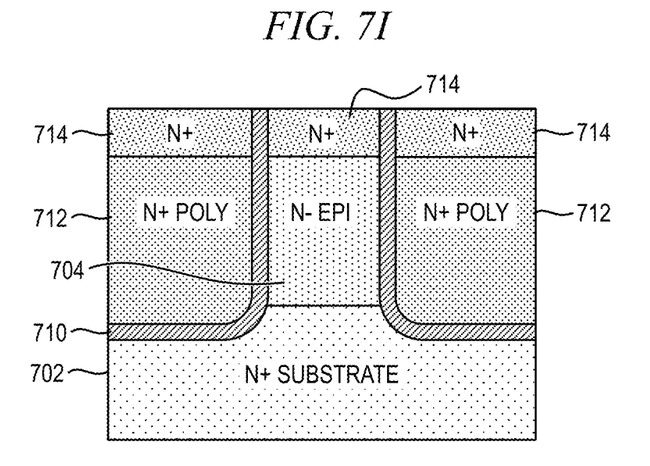

As illustrated in FIG. 7I, doped regions 714 of the first conductivity type, which are n-type (N+) in this exemplary embodiment, are formed in the polysilicon region 712 proximate an upper surface of the polysilicon region, and in the epitaxial layer 704 proximate an upper surface of the epitaxial layer. The doped regions 714 are preferably formed by implanting an n-type dopant (e.g., arsenic or phosphorus) into the polysilicon region 712 and epitaxial layer 704, using ion implantation or another implant process, and serve as low-resistance electrical interconnections to the respective underlying polysilicon region and epitaxial layer. In one or more embodiments, the doped regions 714 may comprise metal silicide formed using a standard silicide formation process, and be known by those skilled in the art.

Figure 7J:
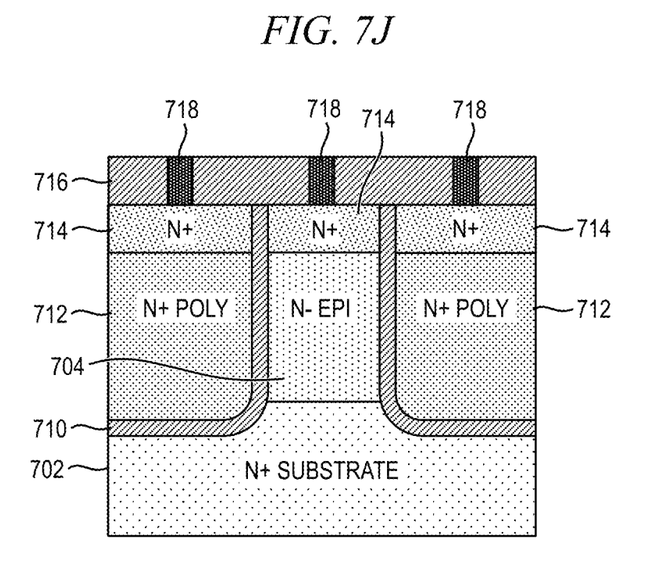

An oxide layer (e.g., silicon dioxide) 716, or other dielectric material layer, is formed over an upper surface of the wafer, including on an upper surface of the doped regions 714 and an upper surface of the oxide layer 710, as depicted in FIG. 7J. The oxide layer 716 may be formed using a deposition process. In order to provide electrical access to the doped regions 714, openings are formed through the oxide layer 716, thereby exposing the underlying doped regions, which are then filled with a conductive material (e.g., aluminum or other metal) to form electrical contacts 718. The oxide layer 716 thus serves to electrically isolate the respective contacts 718 from one another.

Although the illustrative RF switch device 400 shown in FIG. 4 has the functionality of a single pole single throw (SPST) switch, it is to be appreciated that aspects of the invention can be similarly expanded to form a single pole multiple throw (SPMT) switch device. For example, FIGS. 8A and 8B are cross-sectional and symbolic (i.e., schematic) views, respectively, depicting at least a portion of an exemplary single pole double throw (SPDT) RF switch 800, according to one or more embodiments of the invention.

Figure 8A:
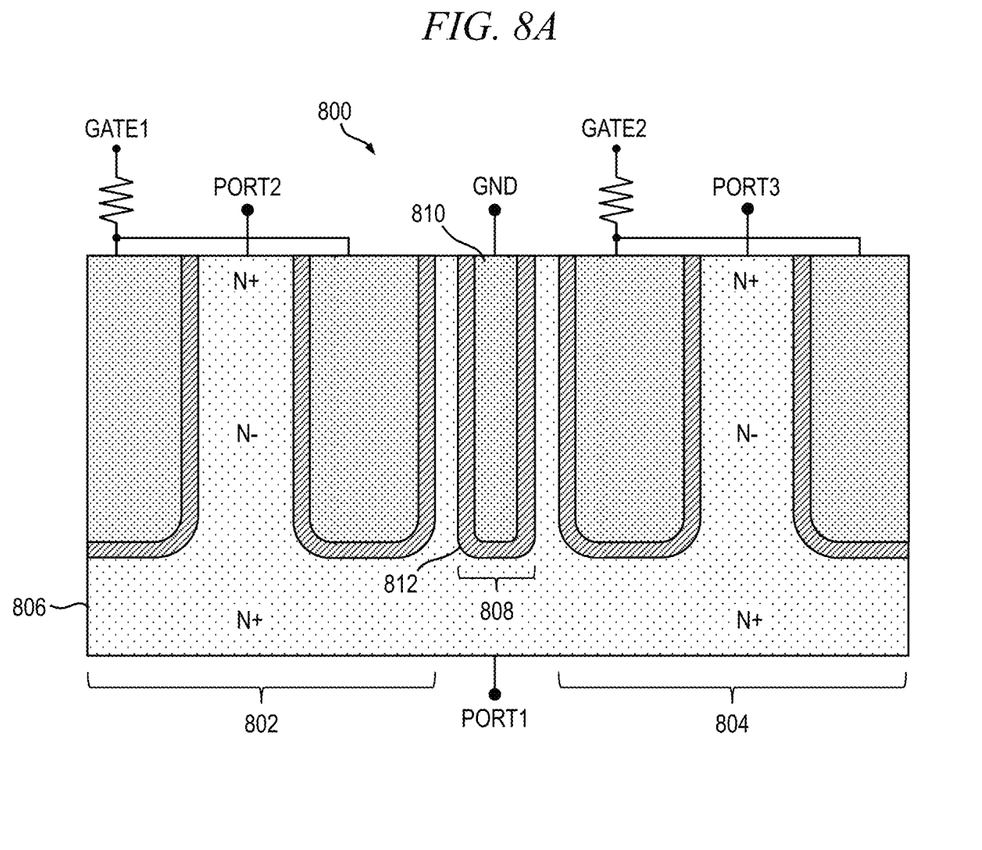
FIGS. 8A and 8B are cross-sectional and symbolic views, respectively, depicting at least a portion of an exemplary single pole, double throw RF switch, according to one or more embodiments of the present invention.
Figure 8B:
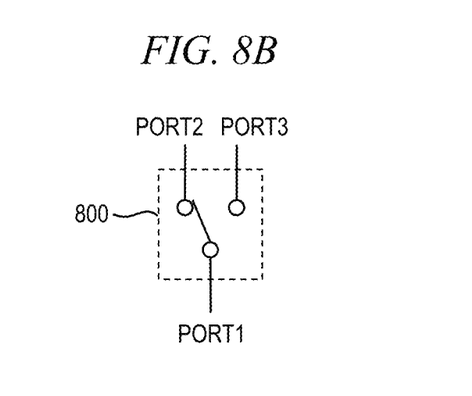

With reference to FIG. 8A, the SPDT RF switch 800 includes a first switch portion 802 and a second switch portion 804 spaced laterally from one another, each of the first and second switch portions being formed on a common substrate 806 (e.g., N+ substrate) in a manner consistent with the illustrative SPST switch 400 depicted in FIG. 4. The SPDT switch 800 further includes a gate 808 disposed between the first and second switch portions 802, 804. The gate 808 includes a polysilicon layer 810 surrounded by an oxide layer 812, or other dielectric material, electrically isolating the gate 808 from a surrounding epitaxial layer in which the gate is formed. In one or more embodiments, the gate 808 is grounded.

The common substrate 806 forms a first switch port (PORT1), a mesa structure in the first switch portion 802 forms a second switch port (PORT2), and a mesa structure in the second switch portion 804 forms a third switch port (PORT3). A symbolic (i.e., schematic) representation of the SPDT RF switch 800, including the designated switch ports, is shown in FIG. 8B. In a similar manner, concepts according to embodiments of the invention may be extended to create a single pole RF switch having an even greater number of throws (e.g., three or higher), as will become apparent to those skilled in the art given the teachings herein.

At least a portion of the techniques of the present invention may be implemented in an integrated circuit. In forming integrated circuits, identical die are typically fabricated in a repeated pattern on a surface of a semiconductor wafer. Each die includes a device described herein, and may include other structures and/or circuits. The individual die are cut or diced from the wafer, then packaged as an integrated circuit. One skilled in the art would know how to dice wafers and package die to produce integrated circuits. Any of the exemplary structures or circuits illustrated in the accompanying figures, or portions thereof, may be part of an integrated circuit. Integrated circuits so manufactured are considered part of this invention.

Those skilled in the art will appreciate that the exemplary structures discussed above can be distributed in raw form (i.e., a single wafer having multiple unpackaged chips), as bare dies, in packaged form, or incorporated as parts of intermediate products or end products that benefit from having power RF switch devices therein formed in accordance with one or more embodiments of the invention, such as, for example, wireless communication systems (e.g., WLAN, WiMAX, GSM, CDMA, HSPA, LTE, satellite, VSAT, Zigbee, etc.), cellular telephone transceiver circuitry, power management ICs, power system integration, etc.

An integrated circuit in accordance with aspects of the present disclosure can be employed in essentially any high-frequency, high-power application and/or electronic system, such as, but not limited to, wireless communication systems, RF power amplifiers, power management ICs, etc. Suitable systems for implementing embodiments of the invention may include, but are not limited to, front-end modules for use in a wireless communication system. Systems incorporating such integrated circuits are considered part of this invention. Given the teachings of the present disclosure provided herein, one of ordinary skill in the art will be able to contemplate other implementations and applications of embodiments of the present invention.

The illustrations of embodiments of the invention described herein are intended to provide a general understanding of the various embodiments, and they are not intended to serve as a complete description of all the elements and features of apparatus and systems that might make use of the circuits and techniques described herein. Many other embodiments will become apparent to those skilled in the art given the teachings herein; other embodiments are utilized and derived therefrom, such that structural and logical substitutions and changes can be made without departing from the scope of this disclosure. The drawings are also merely representational and are not drawn to scale. Accordingly, the specification and drawings are to be regarded in an illustrative rather than a restrictive sense.

Embodiments of the invention are referred to herein, individually and/or collectively, by the term "embodiment" merely for convenience and without intending to limit the scope of this application to any single embodiment or inventive concept if more than one is, in fact, shown. Thus, although specific embodiments have been illustrated and described herein, it should be understood that an arrangement achieving the same purpose can be substituted for the specific embodiment(s) shown; that is, this disclosure is intended to cover any and all adaptations or variations of various embodiments. Combinations of the above embodiments, and other embodiments not specifically described herein, will become apparent to those of skill in the art given the teachings herein.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, steps, operations, elements, and/or components, but do not preclude the presence or addition of one or more other features, steps, operations, elements, components, and/or groups thereof. Terms such as "above," "below," "upper" and "lower" are used to indicate a position of elements or structures relative to one another, rather than absolute positioning.

The corresponding structures, materials, acts, and equivalents of all means or step-plus-function elements in the claims below are intended to include any structure, material, or act for performing the function in combination with other claimed elements as specifically claimed. The description of the various embodiments has been presented for purposes of illustration and description, but is not intended to be exhaustive or limited to the forms disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the various embodiments with various modifications as are suited to the particular use contemplated.

The abstract is provided to comply with 37 C.F.R. § 1.72(b), which requires an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the appended claims reflect, inventive subject matter lies in less than all features of a single embodiment. Thus the following claims are hereby incorporated into the Detailed Description, with each claim standing on its own as separately claimed subject matter.

Given the teachings of embodiments of the invention provided herein, one of ordinary skill in the art will be able to contemplate other implementations and applications of the techniques of embodiments of the invention. Although illustrative embodiments of the invention have been described herein with reference to the accompanying drawings, it is to be understood that embodiments of the invention are not limited to those precise embodiments, and that various other changes and modifications are made therein by one skilled in the art without departing from the scope of the appended claims.

What is claimed is:

1. A radio frequency (RF) switch device, comprising:
a semiconductor substrate, the substrate being doped with an impurity of a first conductivity type at a first doping concentration level;
at least one mesa extending vertically from an upper surface of the substrate and formed contiguous therewith, the mesa including a drift region doped with the impurity of the first conductivity type at a second doping concentration level, the second doping concentration level being less than the first doping concentration level, the mesa forming a primary current conduction path in the RF switch device;
an insulator layer disposed on at least a portion of the upper surface of the substrate and sidewalls of the mesa; and
at least one gate disposed on at least a portion of an upper surface of the insulator layer, the gate at least partially surrounding the mesa,
wherein the RF switch device is configured having single-pole multiple-throw functionality.

2. A radio frequency (RF) switch device, comprising:
a semiconductor substrate, the substrate being doped with an impurity of a first conductivity type at a first doping concentration level;
at least one mesa extending vertically from an upper surface of the substrate and formed contiguous therewith, the mesa including a drift region doped with the impurity of the first conductivity type at a second doping concentration level, the second doping concentration level being less than the first doping concentration level, the mesa forming a primary current conduction path in the RF switch device;
an insulator layer on at least a portion of the upper surface of the substrate and sidewalls of the mesa;
at least one gate on at least a portion of an upper surface of the insulator layer, the gate at least partially surrounding the mesa; and
doped regions formed in respective upper surfaces of the gate and mesa, the doped regions providing electrical interconnection to the respective underlying gate and mesa.

3. The RF switch device according to claim 2, further comprising electrical contacts formed on at least a portion of respective upper surfaces of the doped regions, the electrical contacts being spaced laterally relative to one another.

4. The RF switch device according to claim 3, further comprising an oxide layer formed on the upper surfaces of the doped regions, the oxide layer electrically isolating the electrical contacts from one another.

5. The RF switch device according to claim 1, wherein the mesa comprises an epitaxial layer formed on the upper surface of the substrate.

6. The RF switch device according to claim 1, wherein the mesa comprises low-resistivity, single-crystalline silicon formed using at least one of an epitaxial growth process and a deposition process.

7. The RF switch device according to claim 1, further comprising:
a first terminal formed on a bottom surface of the substrate and electrically connected therewith; and
a second terminal formed on an upper surface of the mesa and electrically connected therewith;
wherein the first and second terminals form input/output ports of the RF switch device through which current will flow when the device is turned on.

8. The RF switch device according to claim 1, wherein the at least one gate comprises a structure which is concentric with respect to the mesa.

9. The RF switch device according to claim 8, wherein the gate comprises a toroidal structure which surrounds at least a portion of the mesa.

10. A radio frequency (RF) switch device, comprising:
a semiconductor substrate, the substrate being doped with an impurity of a first conductivity type at a first doping concentration level;
at least one mesa extending vertically from an upper surface of the substrate and formed contiguous therewith, the mesa including a drift region doped with the impurity of the first conductivity type at a second doping concentration level, the second doping concentration level, the mesa forming a primary current conduction path in the RF switch device;

an insulator layer on at least a portion of the upper surface of the substrate and sidewalls of the mesa; and at least one gate on at least a portion of an upper surface of the insulator layer, the gate at least partially surrounding the mesa, wherein the RF switch device is configured having single pole double throw functionality, wherein the substrate forms a first port of the RF switch device, the at least one mesa comprising first and second mesas, each of the first and second mesas extending vertically from the upper surface of the substrate and formed contiguous therewith, each of the first and second mesas including a drift region doped with the impurity of the first conductivity type at the second doping concentration level, the first and second mesas being spaced apart laterally from one another, the first mesa forming a first primary current conduction path between the substrate and a second port of the RF switch device, the second mesa forming a second primary current conduction path between the substrate and a third port of the RF switch device.

11. The RF switch device according to claim 1, wherein when the gate is biased at a voltage potential greater than a prescribed threshold voltage relative to a voltage potential at either the substrate or the mesa, majority charge carriers in the mesa will be drawn into the drift region, thereby increasing conduction and reducing on-state resistance in the RF switch device.

12. The RF switch device according to claim 1, wherein when the gate is biased at a voltage potential less than a prescribed threshold voltage, the drift region in the mesa becomes depleted and pinches-off, thereby increasing off-state resistance in the RF switch device.

13. The RF switch device according to claim 1, wherein the substrate forms a first port of the RF switch device, and wherein the at least one mesa comprises first and second mesas, the first mesa providing a first primary conduction path between the substrate and a second port of the RF switch device, the second mesa providing a second primary conduction path between the substrate and a third port of the RF switch device.

* * * * *

UNITED STATES PATENT AND TRADEMARK OFFICE
CERTIFICATE OF CORRECTION

PATENT NO. : 12,336,218 B2  
APPLICATION NO. : 17/523437  
DATED : June 17, 2025  
INVENTOR(S) : Shuming Xu Page 1 of 1

It is certified that error appears in the above-identified patent and that said Letters Patent is hereby corrected as shown below:

On the Title Page

Item (73) Assignee, Please change "Powerlite Semiconductor (Shanghai) Co., Ltd., Shanghai (CN)" to --Shanghai Bright Power Semiconductor Co., Ltd., Shanghai (CN)--.

Signed and Sealed this  
Ninth Day of December, 2025

John A. Squires  
*Director of the United States Patent and Trademark Office*